United States Patent [19]

Kakumaru

[11] Patent Number: 5,700,629
[45] Date of Patent: Dec. 23, 1997

[54] DEVELOPING PROCESS

[75] Inventor: Hajime Kakumaru, Hitachi, Japan

[73] Assignee: Hitachi Chemical Company, Ltd., Tokyo, Japan

[21] Appl. No.: 650,944

[22] Filed: May 20, 1996

Related U.S. Application Data

[63] Continuation of Ser. No. 469,788, Jun. 6, 1995, abandoned, which is a continuation of Ser. No. 66,401, May 11, 1993, abandoned, which is a continuation of Ser. No. 656,464, Feb. 19, 1991, abandoned.

[30] Foreign Application Priority Data

Feb. 19, 1990 [JP] Japan ..................... 2-38144

[51] Int. Cl.$^6$ ..................... G03F 7/30
[52] U.S. Cl. ..................... 430/325; 430/309
[58] Field of Search ..................... 430/30, 325, 326, 430/309, 311, 322, 329, 331

[56] References Cited

U.S. PATENT DOCUMENTS 4,197,126  4/1980  Wessells et al. ..................... 430/306

FOREIGN PATENT DOCUMENTS

| 2 508 663 | 12/1982 | France . | |
|---|---|---|---|
| 1 943 660 | 3/1970 | Germany . | |
| 3 713 329 | 5/1987 | Germany . | |
| 56-110 940 | 9/1981 | Japan . | |
| 58-17443 | 2/1983 | Japan | 430/325 |
| 2-046 465 | 2/1990 | Japan . | |
| 2046465 | 2/1990 | Japan . | |
| 1 259 857 | 1/1972 | United Kingdom . | |
| 1259857 | 1/1972 | United Kingdom . | |
| 2085612 | 4/1982 | United Kingdom | 430/325 |
| 2 099 730 | 12/1982 | United Kingdom . | |

*Primary Examiner*—Kathleen Duda
*Attorney, Agent, or Firm*—Antonelli, Terry, Stout & Kraus, LLP.

[57] ABSTRACT

A resist pattern good in resolution and image precision can be obtained by a developing process characterized by jetting a gas on a developing surface during development or after development.

18 Claims, 1 Drawing Sheet

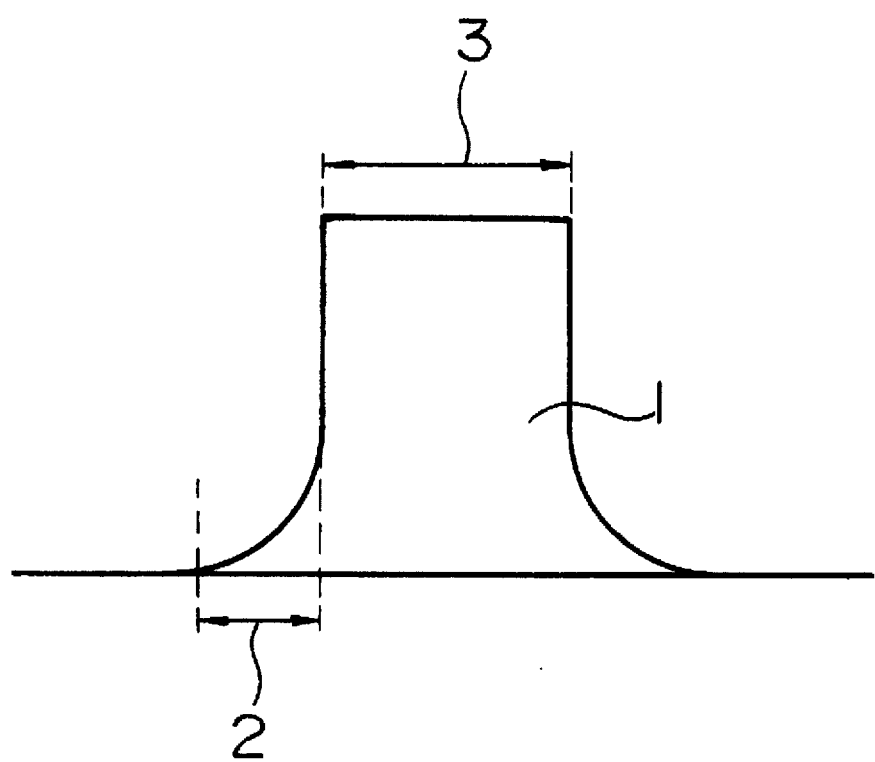

DEVELOPING PROCESS

This application is a Continuation application of application Ser. No. 469,788, filed Jun. 6, 1995, now abandoned, which application is a Continuation application of application Ser. No. 066,401, filed May 11, 1993, (now abandoned) which application is a Continuation application of application Ser. No. 656,464, filed Feb. 19, 1991 (now abandoned).

BACKGROUND OF THE INVENTION

This invention relates to a process for developing a photosensitive material. More particularly, this invention relates to a process for developing a photosensitive material using an aqueous solution as a developer so as to improve the degree of resolution, image precision, and the like.

Films formed from photosensitive materials such as photosensitive resin composition are used as a photo resist in the production of printed wiring boards or as a relief in printing plate. These photosensitive materials in the form of liquid are coated on a substrate or in the form of film are laminated on a substrate, exposed to actinic light imagewisely, and developed using a liquid developer to use the resulting image for predetermined object.

The photosensitive materials include negative type materials wherein insolubilization to a developer is brought about by exposure to actinic light and positive type materials wherein solubilization to a developer is brought about by exposure to actinic light. The developers include a solvent developer using an organic solvent, an alkaline developer using an alkaline aqueous solution, a semi-solvent developer using a mixture of an organic solvent and an alkaline aqueous solution, etc.

As to developing processes, there are known a process for immersing in a developing solution, a process wherein rocking or ultrasonic is provided during immersion, and a most general process for spraying a developing solution.

But recently, particularly in the field of photo resists, photo resist images formed are required to have very high precision with a demand for highly densified printed wiring boards. But according to known developing processes, it becomes almost impossible to obtain images with high resolution. For example, it is impossible to remove very narrow portions by the development, or it is impossible to obtain a wall of image vertical to the substrate, resulting in causing broadening of the image wall at the bottom portion.

SUMMARY OF THE INVENTION

It is an object of the present invention to provide a process for developing a photosensitive material with improved resolution of the photosensitive material and improved image precision and overcoming disadvantages of known processes mentioned above.

The present invention provides a process for developing a photosensitive material which comprises contacting a surface of the photosensitive material with a developing solution, while jetting a gas at the surface of the photosensitive material during development or after development.

BRIEF DESCRIPTION OF THE DRAWING

The attached drawing is a schematic cross-sectional view explaining the broadening length of an image wall at the bottom portion.

DESCRIPTION OF THE PREFERRED EMBODIMENTS

The process of the present invention is characterized by jetting a gas at a surface of a photosensitive material during development or after development using a developing solution.

As the developing solution, there can be used conventional developing solutions for photosensitive materials. From the viewpoint of environmental pollution, the use of an alkaline aqueous solution as a developer is preferable.

The term "development" used in the present invention has the same meaning as generally used in the field of photo resist. In the case of negative type photosensitive material, non-exposed portions are removed to form an image on exposed portions. On the other hand, in the case of positive type photosensitive material, exposed portions are removed to form an image on non-exposed portions.

In the present invention, the development can be carried out by a conventional method, such as by immersing a photosensitive material in a developing solution, or by spraying a developing solution on a photosensitive material, while jetting a gas on the developing surface of the photosensitive material. It is preferable to jet the gas on the developing surface during development by spraying.

As the gas, there can be used air, a nitrogen gas, a carbon dioxide gas, a helium gas, an argon gas, etc. From the economical point of view, the use of air is preferable.

When the gas is jetted on the developing surface, it is preferable to control the temperature of gas to be contacted with the developing surface at 0° to 80° C., more preferably 5° to 40° C.

When the gas temperature is too low or too high, a photosensitive film is often damaged. Further, when the temperature is lower than 0° C., the water in the developing solution is easily freezed. In order to control the gas temperature at the desired temperature, for example, in order to jet a gas (e.g. air) at room temperature (23° C.), it can be carried out to jet a gas (e.g. air) with a constant temperature using a heat exchanger. Whether the gas temperature is at the predetermined temperature or not can be determined by measuring the surface temperature of the developing surface during the development or immediately before the development using a various kinds of thermometers (e.g. an infrared thermometer).

The pressure of gas jetted at the developing surface is preferably 0.1 kgf/cm$^2$ to 6 kgf/cm$^2$, more preferably 0.5 kgf/cm$^2$ to 4 kgf/cm$^2$. When the pressure is too low, the effects of the present invention are not fully exhibited. On the other hand, when the pressure is too high, the photosensitive film is easily damaged.

The pressure of gas means the pressure of gas immediately before jetting from, for example, a nozzle. A predetermined pressure of gas can be obtained by using a pressure reducing valve in the case of using a bomb, or compressed air using a compressor, as a gas source. Whether the gas pressure is at the predetermined pressure or not can easily be determined by measuring the pressure by a pressure indicator installed between a nozzle or the like and a bomb, a compressor, or the like.

Jetting of gas with a predetermined pressure can be carried out by making the distance from an outlet of jetting gas (e.g. a nozzle) to the developing surface preferably 5 to 50 cm, more preferably 10 to 30 cm.

Jetting of gas on the developing surface is preferably carried out so as not to dry the developing surface. Jetting of gas on the developing surface can be carried out simultaneously while immersing a photosensitive material in a developing solution, or while spraying a developing solution on the photosensitive material. Further, jetting of gas can be carried out after immersing the photosensitive material in the developing solution or jet spraying the developing solution and before a subsequent step such a water-washing step.

Jetting of gas on the developing surface can be carried out by installments. The gas can be jetted for preferably 1 to 30 seconds as a total, more preferably 2 to 15 seconds.

One preferable embodiment of the present invention is to develop using an alkaline aqueous solution (e.g. an aqueous solution of sodium carbonate). In the development of photosensitive material, the gas jetted on the developing surface during the development is controlled at a temperature of 0° C. to 80° C. and a pressure of 0.1 kgf/cm² to 6 kgf/cm². The gas is jetted for 1 to 30 seconds on the developing surface after spray jetting of the photosensitive material with minimum developing time, followed by spray jetting again for a period of ¼ to ½ of the minimum developing time (i.e. a process of spray jetting-gas jetting-spray jetting).

Another preferable embodiment of the present invention is a process wherein the gas jetting is carried out simultaneously with the spray jetting with the minimum developing time for 2 to 5 seconds at a time and two or three times as a total so as to shorten the above-mentioned developing process.

The term "minimum developing time" means a minimum time necessary for removing a broad portion of non-exposed portion (10 mm×10 mm or more) by immersing in or spray jetting (except for gas jetting) of developing solution in the case of using a negative type photosensitive material, or a minimum time necessary for removing a broad portion of exposed portion (10 mm×10 mm or more) by immersing in or spray jetting (except for gas jetting) of developing solution in the case of using a positive type photosensitive material.

The present invention is illustrated by way of the following Examples.

EXAMPLES 1 and 2

Comparative Example 1

Copper surfaces of a substrate made of a glass epoxy material laminated with copper foils (35 μm thick) on both sides thereof (MCL-E-61, a trade name, mfd. by Hitachi Chemical Co., Ltd.) were polished with sand paper #800, washed with water and dried in an air stream. Then, the substrate was heated to 60° C. and laminated with a photosensitive film (Photec 865AFT-50, a photosensitive layer of 50 μm thick, an alkali development type, a negative type) using a laminator (laminate roll temperature 120° C., air cylinder pressure 3.0 kgf/cm², laminating speed 1.5 m/min). A predetermined number of such samples were prepared and exposed to a 3 kW high-pressure mercury lamp (201B, a trade name, mfd. by ORC Seisakusho, Ltd.) via a photo mask with various kinds of line widths and line spaces (line width=line space) so as to evaluate resolution of the photo resist at 120 mJ/cm². Then, the exposed sample was immersed in a 1.2% aqueous solution of sodium carbonate with rocking at 30° C., developed at room temperature (23° C.) while jetting air at a pressure of 4 kgf/cm². Then, the developed sample was washed with city water at 20° C. for 40 seconds, dried and subjected to evaluation of resolution.

In Comparative Example 1, the air jetting was not conducted. Non-exposed portions were completely removed by rocking immersion for 100 seconds.

The resolution was evaluated by the narrowest line width of the formed image after the developing step.

The results are shown in Table 1.

TABLE 1

| Developing steps | Comparative Example 1 | Example 1 | Example 2 |
| --- | --- | --- | --- |
| rocking immersion ↓ | 100 sec. | 50 sec. | 50 sec. |
| air jetting ↓ | — | 10 sec. | 3 sec. |
| rocking immersion ↓ | — | 50 sec. | 30 sec. |
| air jetting ↓ | — | — | 3 sec. |
| rocking immersion ↓ | — | — | 20 sec. |
| air jetting | — | — | 3 sec. |
| Resolution (μm) | 80 | 70 | 65 |

EXAMPLES 3 to 7

Samples were prepared, exposed to light and developed in the same manner as described in Example 2 except for changing the pressure of jetting air at the time of development as shown in Table 2.

The results are shown in Table 2.

TABLE 2

| Example No. | Pressure of jetting air at 23° C. (kgf/cm²) | Resolution (μm) |
| --- | --- | --- |
| Example 3 | 0.5 | 75 |
| Example 4 | 2.0 | 65 |
| Example 5 | 5.0 | 65 |
| Example 6 | 0.1 | 80 |
| Example 7 | 8.0 | 85 |

EXAMPLES 8 to 10

Comparative Example 2

Samples were prepared, and exposed to light in the same manner as described in Example 1. The development was carried out as shown in Table 3 by spray jetting a 1.2% aqueous solution of sodium carbonate at 30° C. at a spray pressure of 1.5 kgf/cm² (at the developing surface) with a flow rate of 2 liter/min (at the developing surface), jetting air at a pressure of 4 kgf/cm² to carry out development, washing with city water at 20° C. for 40 seconds, and drying.

Resolution and broadening length (d) were evaluated and Listed in Table 3.

The broadening length (d) at the bottom of image wall is shown in the attached drawing wherein numeral 1 denotes a photosensitive film, numeral 2 denotes the broadening length (d) and numeral 3 denotes a line width.

TABLE 3

| | Example 8 | Example 9 | Example 10 | Comparative Example 2 |
| --- | --- | --- | --- | --- |
| Developing steps | | | | |
| spray jetting ↓ | 40 sec. | 40 sec. | 30 sec. | 75 sec. |

TABLE 3-continued

|  | Example 8 | Example 9 | Example 10 | Comparative Example 2 |
|---|---|---|---|---|
| air jetting ↓ | 10 sec. | 5 sec. | 3 sec. | — |
| spray jetting ↓ | 35 sec. | 35 sec. | 25 sec. | — |
| air jetting ↓ | — | 5 sec. | 3 sec. | — |
| spray jetting ↓ | — | — | 20 sec. | — |
| air jetting | — | — | 3 sec. | — |
| Resolution (μm) | 65 | 65 | 60 | 90 |
| Broadening length (μm) | 5 | 4 | 3 | 6 |

Examples 11 and 12

Comparative Example 3

A solvent developing type photosensitive film (Photec 145F-40, a trade name, mfd. by Hitachi Chemical Co., Ltd.) was laminated on a substrate in the same manner as described in Example 1.

Exposure to light was carried out in the same manner as described in Example 1 using the same light source via the same photo mask at 60 mJ/cm$^2$. The development was carried out as shown in Table 4 by spray jetting 1,1,1-trichloroethane at 18° C. at a spray pressure of 2 kgf/cm$^2$, with a distance of 15 cm from a nozzle, air jetting at room temperature (23° C.) at a pressure of 4 kgf/cm$^2$ for developing, washing with city water at 20° C. for 40 seconds, and drying. The resolution and broadening length were evaluated in the same manner as described in Examples 8 to 10.

In Comparative Example 3, no air jetting was conducted.

The results are shown in Table 4.

TABLE 4

|  | Example 11 | Example 12 | Comparative Example 3 |
|---|---|---|---|
| Developing steps |  |  |  |
| spray jetting ↓ | 40 sec. | 30 sec. | 60 sec. |
| air jetting ↓ | 10 sec. | 5 sec. | — |
| spray jetting ↓ | 20 sec. | 15 sec. | — |
| air jetting ↓ | — | 5 sec. | — |
| spray jetting | — | 15 sec. | — |
| Resolution (μm) | 70 | 60 | 80 |
| Broadening length (μm) | 5 | 3 | 6 |

As mentioned above, by employing the developing process of the present invention, there can be formed an image (resist pattern) good in resolution, small in the broadening length at the bottom of image wall and excellent in image precision.

What is claimed is:

1. A process for developing an image-wise exposed photosensitive material which comprises contacting a surface of the photosensitive material comprising a photo resist in the surface of a printed circuit board or a relief in a printing plate, with a developing solution by immersion or by spraying, while jetting a gas at a pressure of 0.1 to 6 kgf/cm$^2$ and at the surface of the photosensitive material so as to remove any narrow portions by the development and so as not to dry a developing surface during development of image whereby the image developed has improved resolution with a wall vertical to a substrate.

2. A process according to claim 1, wherein the temperature of gas at the surface of the photosensitive material is 0° C. to 80° C.

3. A process according to claim 1, wherein the developing solution is an alkaline aqueous solution.

4. A process according to claim 1, wherein the gas is air.

5. A process according to claim 1, wherein the temperature of the gas at the surface of the photosensitive material is 0° C. to 80° C.; the pressure of the gas is 0.5 kgf/cm$^2$ to 4 kgf/cm$^2$; and the developing solution is an alkaline aqueous solution and the gas comprises air.

6. A process according to claim 1, wherein a broadening length at a bottom of an image wall is 3 to 5 μm or less.

7. A process for developing an image-wise exposed photosensitive material which comprises a step of spray jetting a developing solution on a surface of the photosensitive material comprising a photo resist in the production of a printed wiring board or a relief in a printing plate, a step of jetting air at a surface of 0.1 to 6 kgf/cm$^2$ and at the surface of the photosensitive material so as to remove very narrow portions by the development and so as not to dry a developing surface during development of an image and repeating said steps one or more times whereby the image developed has improved resolution with a wall vertical to a substrate.

8. A process according to claim 1, wherein the development is carried out by gas jetting simultaneously with spray jetting of the developing solution, with a minimum developing time of 2 to 5 seconds at a time and two or three times as a total.

9. A process according to claim 1, wherein jetting of the gas is carried out for 1 to 30 seconds as a total.

10. A process according to claim 1, wherein the developing solution is sprayed onto the photosensitive material and the gas comprises helium gas, argon gas, nitrogen gas, carbon dioxide gas or air.

11. A process according to claim 1, wherein in contacting of the surface of the photosensitive material with the developing solution, the developing solution is sprayed onto the surface and the time of jetting the gas is 1–5 seconds.

12. A process of developing an image-wise exposed photosensitive material which comprises immersing a surface of the photosensitive material comprising a photo resist in the production of a printed wiring board or a relief in a printing plate, within a developing solution or spraying a surface of the photosensitive material with a developing solution, and jetting a gas at a surface of 0.1 to 6 kgf/cm$^2$ and at the surface of the photosensitive material so as to remove very narrow portions by the development and so as to not to dry a developing surface during development of an image wherein in a case where the photosensitive material is a negative photosensitive material, non-exposed portions are removed and in a case where the photosensitive material is a positive photosensitive material exposed portions are removed, whereby the image developed has improved resolution with a wall vertical to a substrate.

13. A process according to claim 12, wherein the temperature of the gas at the surface of the photosensitive material is 0° C. to 80° C.

14. A process according to claim 12, wherein the developing solution is an alkaline aqueous solution.

15. A process according to claim 12, wherein the gas is air.

16. A process according to claim 12, wherein the temperature of the gas at the surface of the photosensitive material is 0° C. to 80° C.; the pressure of the gas is 0.5 kgf/cm$^2$ to 4 kgf/cm$^2$; the developing solution is an alkaline aqueous solution and the gas comprises air.

17. A process according to claim 12, wherein a broadening length at a bottom of an image wall is 3–5 μm.

18. A process according to claim 12, wherein the immersing of the surface or spraying of the surface with the developing solution is effected for a minimum developing time and jetting a gas is effected for a period of from 1–30 seconds.

* * * * *